(12) United States Patent
Tu et al.

(10) Patent No.: US 11,393,776 B2
(45) Date of Patent: Jul. 19, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Shun-Tsat Tu, Kaohsiung (TW); Pei-Jen Lo, Kaohsiung (TW); Yan-Si Lin, Kaohsiung (TW); Chien-Chi Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 358 days.

(21) Appl. No.: 15/982,923

(22) Filed: May 17, 2018

(65) Prior Publication Data
US 2019/0355676 A1    Nov. 21, 2019

(51) Int. Cl.
| | | |
|---|---|---|
| H01F 5/00 | (2006.01) |
| H01L 23/64 | (2006.01) |
| H01L 23/498 | (2006.01) |
| H01F 27/28 | (2006.01) |
| H01F 27/32 | (2006.01) |
| H01F 41/04 | (2006.01) |
| H01L 21/48 | (2006.01) |

(52) U.S. Cl.
CPC ....... *H01L 23/645* (2013.01); *H01F 27/2804* (2013.01); *H01F 27/323* (2013.01); *H01F 41/041* (2013.01); *H01L 21/4857* (2013.01); *H01L 23/49822* (2013.01); *H01L 23/49838* (2013.01); *H01F 2027/2809* (2013.01)

(58) Field of Classification Search
CPC ......... H01F 2027/2809; H01F 27/2804; H01F 38/08; H01F 17/0006; H01F 17/0013; H01F 5/003; H01F 27/323
USPC ........................................................ 336/200
See application file for complete search history.

(56) References Cited

U.S. PATENT DOCUMENTS

| | | | | |
|---|---|---|---|---|
| 5,448,822 | A * | 9/1995 | Wu ........................ | G11B 5/313 29/603.24 |
| 5,519,582 | A * | 5/1996 | Matsuzaki .............. | H01L 24/73 361/783 |
| 5,608,964 | A * | 3/1997 | Shimizu ............... | G11B 5/3109 29/603.14 |
| 5,656,849 | A * | 8/1997 | Burghartz ........... | H01L 23/5227 257/528 |
| 6,172,844 | B1* | 1/2001 | Luo ........................ | G11B 17/02 360/98.08 |
| 6,191,916 | B1* | 2/2001 | Sasaki .................... | G11B 5/313 360/123.4 |

(Continued)

*Primary Examiner* — Elvin G Enad
*Assistant Examiner* — Joselito S. Baisa
(74) *Attorney, Agent, or Firm* — Foley & Lardner LLP

(57) ABSTRACT

A semiconductor device package includes a substrate, a first coil, a dielectric layer and a second coil. The first coil is disposed on the substrate. The first coil includes a first conductive segment and a second conductive segment. The dielectric layer covers the first conductive segment of the first coil and the second conductive segment of the first coil and defines a first recess between the first conductive segment of the first coil and the second conductive segment of the first coil. The second coil is disposed on the dielectric layer. The second coil has a first conductive segment disposed within the first recess.

11 Claims, 13 Drawing Sheets

(56) References Cited

U.S. PATENT DOCUMENTS

| | | | | |
|---|---|---|---|---|
| 6,191,918 B1* | 2/2001 | Clarke | G11B 5/313 | 360/123.2 |
| 6,204,997 B1* | 3/2001 | Sasaki | G11B 5/3123 | 360/123.39 |
| 6,396,362 B1* | 5/2002 | Mourant | H03H 7/42 | 333/25 |
| 6,466,401 B1* | 10/2002 | Hong | G11B 5/313 | 360/123.25 |
| 6,538,846 B1* | 3/2003 | Sato | G11B 5/313 | 360/125.45 |
| 6,771,463 B2* | 8/2004 | Kamijima | G11B 5/313 | 257/E27.046 |
| 6,861,937 B1* | 3/2005 | Feng | G11B 5/3116 | 336/200 |
| 7,053,747 B2* | 5/2006 | Joodaki | H01F 17/0006 | 257/531 |
| 7,079,353 B2* | 7/2006 | Hsiao | G11B 5/313 | 360/123.4 |
| 7,085,099 B2* | 8/2006 | Sasaki | G11B 5/31 | 360/123.41 |
| 7,116,518 B2* | 10/2006 | Han | G11B 5/3106 | 360/125.45 |
| 7,287,314 B2* | 10/2007 | Guthrie | G11B 5/3116 | 29/603.12 |
| 7,319,572 B2* | 1/2008 | Iitsuka | G11B 5/3103 | 360/123.01 |
| 7,428,776 B2* | 9/2008 | Inaguma | G11B 5/127 | 29/603.12 |
| 7,864,014 B2* | 1/2011 | Ezzeddine | H01P 5/10 | 336/200 |
| 8,042,260 B2* | 10/2011 | Hopper | H01L 23/5227 | 336/212 |
| 8,054,155 B2* | 11/2011 | Raczkowski | H01L 23/645 | 336/200 |
| 8,072,307 B2* | 12/2011 | Kijima | H01F 27/2804 | 336/200 |
| 8,237,269 B2* | 8/2012 | Tang | H01L 23/48 | 257/734 |
| 8,327,523 B2* | 12/2012 | Whitworth | H01F 17/0006 | 216/48 |
| 8,384,189 B2 | 2/2013 | Lin | | |
| 8,760,240 B2* | 6/2014 | Yehezkely | H03H 7/48 | 333/119 |
| 9,287,344 B2* | 3/2016 | Sin | H01L 21/76898 | |
| 9,431,992 B2* | 8/2016 | Yehezkely | H01P 5/184 | |
| 2004/0056749 A1* | 3/2004 | Kahlmann | H01L 27/08 | 336/200 |
| 2008/0284552 A1* | 11/2008 | Lim | H01F 19/08 | 336/200 |
| 2009/0045903 A1* | 2/2009 | Lin | H01F 17/0006 | 336/200 |
| 2010/0026368 A1* | 2/2010 | Tang | H01L 23/49534 | 327/361 |

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly, to a semiconductor device package including a pattern and a method of manufacturing the same.

2. Description of the Related Art

As the development of the system in package (SIP), passive electronic components (e.g., a capacitor, an inductor or a transformer) can be integrated within the package (e.g., integrated passive device, IPD). To increase an inductance of an inductor integrated in the package, the number of turns of the inductor should be increased. However, this would also increase the size of the package device. Another approach is to stack two coils. However, this would increase the thickness of the package device.

SUMMARY

In accordance with some embodiments of the present disclosure, a semiconductor device package includes a substrate, a first coil, a dielectric layer and a second coil. The first coil is disposed on the substrate. The first coil includes a first conductive segment and a second conductive segment. The dielectric layer covers the first conductive segment of the first coil and the second conductive segment of the first coil and defines a first recess between the first conductive segment of the first coil and the second conductive segment of the first coil. The second coil is disposed on the dielectric layer. The second coil has a first conductive segment disposed within the first recess.

In accordance with some embodiments of the present disclosure, a semiconductor device package includes a substrate, a first coil, a dielectric layer and a second coil. The substrate has a top surface. The first coil is disposed on the top surface of the substrate. The first coil has a first conductive segment. The dielectric layer covers the first conductive segment and the second conductive segment. The second coil is disposed on the dielectric layer. The second coil has a first conductive segment. The first conductive segment of the first coil and the first conductive segment of the second coil overlap in a direction substantially parallel to the top surface of the substrate.

In accordance with some embodiments of the present disclosure, a semiconductor device package includes a substrate, a first coil, a dielectric layer and a second coil. The substrate has a top surface. The first coil is disposed on the top surface of the substrate. The first coil has a plurality of conductive segments. The dielectric layer covers the first coil and defines a recess between two adjacent conductive segments of the first coil. The second coil is disposed on the dielectric layer. The second coil has a plurality of conductive segments. One of the plurality of the conductive segments of the second coil is disposed within the recess.

Figure 1A:
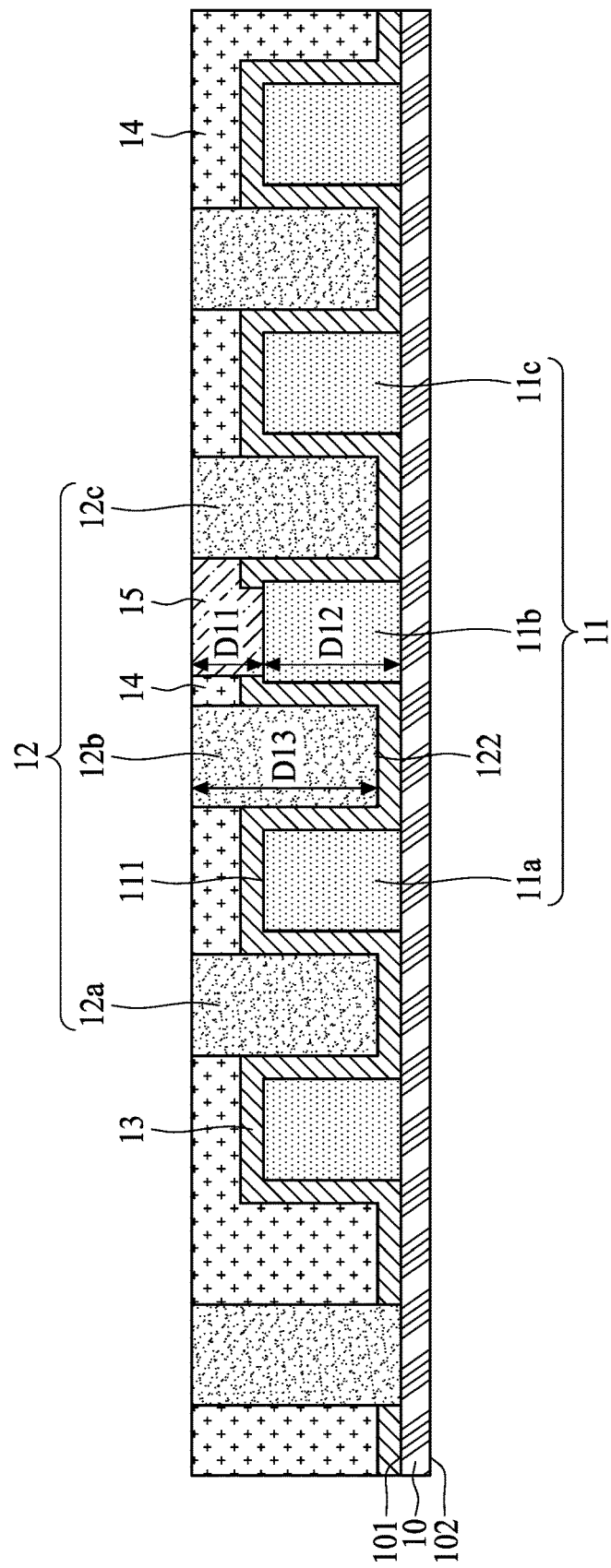
FIG. 1A illustrates a cross-sectional view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1A illustrates a cross-sectional view of a semiconductor device package 1 in accordance with some embodiments of the present disclosure. The semiconductor device package 1 includes a substrate 10, patterned conductive layers 11, 12, a dielectric layer 13 and a package body 14.

The substrate 10 may be, for example, a printed circuit board, such as a paper-based copper foil laminate, a composite copper foil laminate, or a polymer-impregnated glass-fiber-based copper foil laminate. In some embodiments, the substrate 10 may be, for example, a glass substrate. The substrate 10 may include an interconnection structure (or electrical connection), such as a redistribution layer (RDL) or a grounding element. The substrate 10 may include a surface 101 and a surface 102 opposite to the surface 101.

The patterned conductive layer 11 is disposed on the surface 101 of the substrate 10. The patterned conductive layer 11 is, or includes, a conductive material such as a metal or metal alloy. Examples include gold (Au), silver (Ag), aluminum (Al), copper (Cu), or an alloy thereof. As shown in FIG. 1A, the patterned conductive layer 11 includes a plurality of segments 11a, 11b, 11c from the cross-sectional view of the semiconductor device package 1. The segments 11a, 11b, 11c are separated from each other. For example, the segment 11a is spaced apart from its adjacent segments (e.g., the segment 11b), and the segment 11b is spaced apart from its adjacent segments (e.g., the segment 11a and the segment 11c). For example, a recess (or gap) is defined between two adjacent segments (e.g., the segment 11a and the segment 11b or the segment 11b and the segment 11c).

The dielectric layer 13 (or passivation layer) is disposed on the surface 101 of the substrate 10 and the patterned conductive layer 11. For example, the dielectric layer 13 is conformally disposed on the patterned conductive layer 11. In some embodiments, a thickness of the dielectric layer 13 is substantially uniform. The dielectric layer 13 covers at least a portion of the patterned conductive layer 11. For example, the dielectric layer 13 covers a top surface and sidewall (lateral surfaces) of the segment 11a, 11c of the patterned conductive layer 11. For example, the dielectric layer 13 covers a portion of a top surface and sidewall of the segment 11b of the patterned conductive layer 11 and exposes the rest portion of the top surface of the segment 11b for electrically connection. In some embodiments, the dielectric layer 13 includes polymer, silicon oxide, nitride oxide, gallium oxide, aluminum oxide, scandium oxide, zirconium oxide, lanthanum oxide or hafnium oxide.

The patterned conductive layer 12 is disposed on the dielectric layer 13. The patterned conductive layer 12 is, or includes, a conductive material such as a metal or metal alloy. In some embodiments, the patterned conductive layer 12 and the conductive layer 11 may include the same material. Alternatively, the patterned conductive layer 12 and the conductive layer 11 include different materials. As shown in FIG. 1A, the patterned conductive layer 12 includes a plurality of segments 12a, 12b, 12c from the cross-sectional view of the semiconductor device package 1. The segments 11a, 11b, 11c are disposed within the recesses or gaps defined by the patterned conductive layer 11. For example, the segment 12a is disposed within the recess defined by the segment 11a of the patterned conductive layer 11 and its adjacent segment, the segment 12b is disposed within the recess defined by the segment 11a and the segment 11b of the patterned conductive layer 11, and the segment 12c is disposed within the recess defined by the segment 11b and the segment 11c of the patterned conductive layer 11. For example, a portion of the patterned conductive layer 12 (including the segments 12a, 12b and 12c) and a portion of the patterned conductive layer 11 (including the segments 11a, 11b and 11c) overlap in a direction substantially parallel to the surface 101 of the substrate 10. For example, a distance between a surface 111 (also referred to as a top surface) of the each of the segments 11a, 11b, 11c of the patterned conductive layer 11 and the surface 101 of the substrate 10 is greater than a distance between a surface 122 (also referred to as a bottom surface) of the each of the segments 12a, 12b, 12c of the patterned conductive layer 12 and the surface 101 of the substrate 10.

Figure 1B:
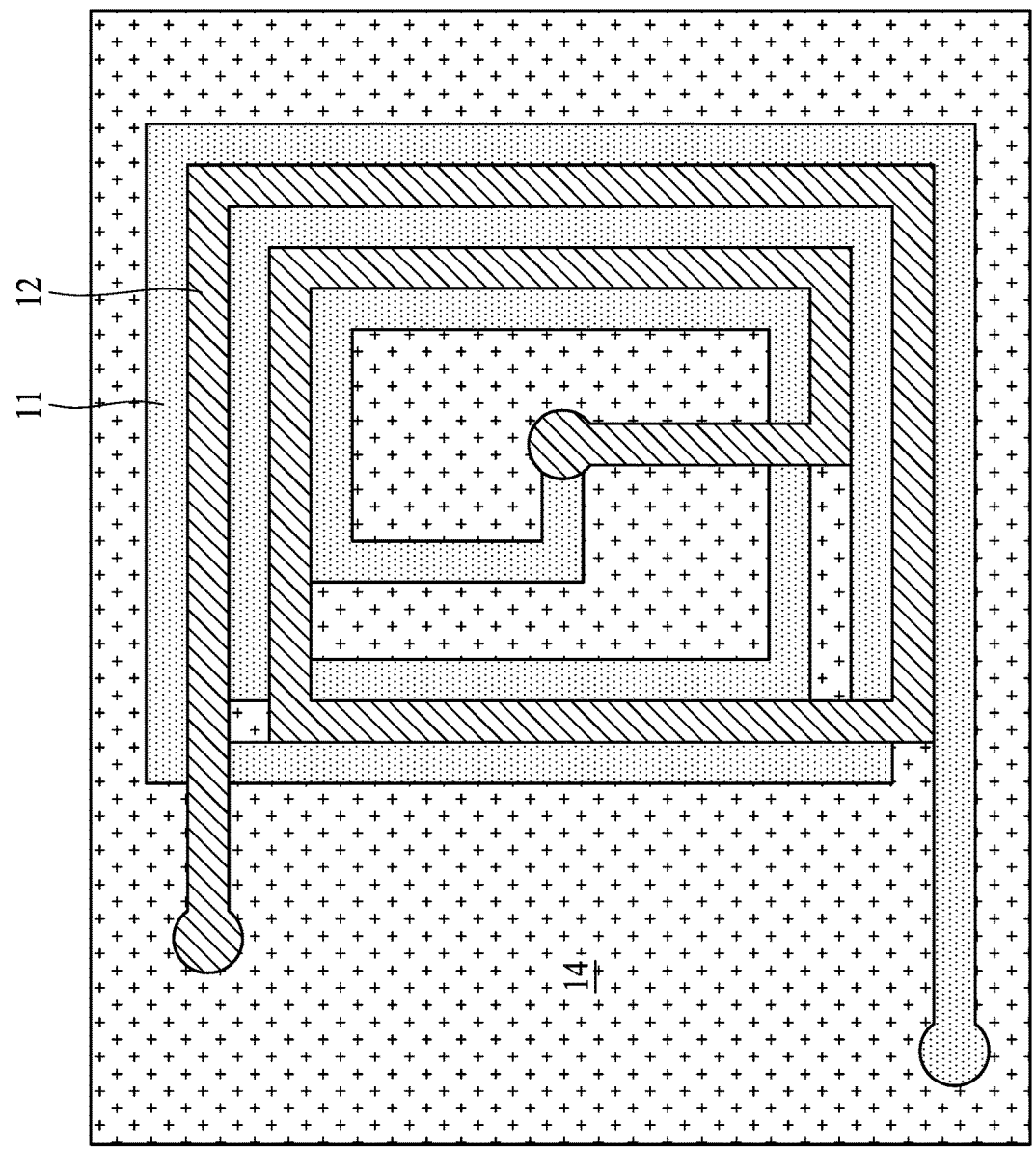
FIG. 1B illustrates a top view of the semiconductor device package in FIG. 1A in accordance with some embodiments of the present disclosure.

The segments 12a, 12b, 12c are physically spaced apart from each other. For example, the segment 12a is spaced apart from its adjacent segments (e.g., the segment 1bb), and the segment 12b is spaced apart from its adjacent segments (e.g., the segment 12a and the segment 12c). In some embodiments, the segment 12b and the segment 12c are electrically connected through a connection structure 15. The patterned conductive layer 12 is spaced apart from the patterned conductive layer 11 by the dielectric layer 13. For example, the dielectric layer 13 is disposed between the patterned conductive layer 12 and the patterned conductive layer 11. In some embodiments, the patterned conductive layer 12 and the patterned conductive layer 11 are electrically connected through the connection structure 15 to form or define an inductor (or coil) as shown in FIG. 1B, which illustrates a top view of the semiconductor device package 1 in accordance with some embodiments of the present disclosure. For example, the connection structure 15 is disposed across the segment 11b of the patterned conductive layer 11 to connect the segment 12b and the segment 12c of the patterned conductive layer 12. For example, as shown in FIG. 1B, one terminal of the patterned conductive layer 11 is electrically connected to one terminal of the patterned conductive layer 12 to define the inductor. In some embodiments, a thickness D11 of the connection structure 15 is less than a thickness D12 of the segment 11a, 11b or 11c of the patterned conductive layer 11 or a thickness D13 of the segment 12a, 12b or 12c of the patterned conductive layer 12.

The patterned conductive layer 11 and the patterned conductive layer 12 collectively define an inductor which can be magnetically coupled to a magnetic field to induce a current within the patterned conductive layers 11 and 12. For example, the current in the patterned conductive layer 11 and the patterned conductive layer 12 flow in the same direction (e.g., in clockwise direction or in counterclockwise direction). Since the patterned conductive layer 11 and the patterned conductive layer 12 are connected, the total number of turns of the inductor defined by the patterned conductive layer 11 and the patterned conductive layer 12 increases, which would in turn increase an inductance of the inductor.

In some embodiments, an inductance of an inductor with a single coil can be increased by increasing the number of turns of the single coil. However, this would also increase the size (e.g., area) of the inductor. In some embodiments, two coils may be directly stacked and connected to increase an inductance of an inductor. For example, one coil is disposed on another coil without any overlapping portion in a direction parallel to a top surface of a substrate on which the coils are disposed, which would increase the thickness of the inductor. In accordance with the embodiments in FIGS. 1A and 1B, the upper coil (e.g., the patterned conductive layer 12) is disposed over the lower coil (e.g., the patterned conductive layer 11) while the segments (e.g., segments 12a, 12b, 12c) of the upper coil are engaged to the recesses or gaps defined by the segments (e.g., segments 11a, 11b, 11c) of the lower coil, which allows the inductor (including the upper coil and the lower coil) increasing the inductance without increasing the area or the thickness of the semiconductor device package 1. In some embodiments, compared to the stacked coils without overlapping portion, the thickness of the inductor as shown in FIG. 1A can be reduced by about 30% to about 35%.

The package body 14 is disposed on the substrate 10 to cover the patterned conductive layers 11, 12, the dielectric layer 13 and the connection structure 15. In some embodiments, the package body 14 includes an epoxy resin including fillers, a molding compound (e.g., an epoxy molding compound or other molding compound), a polyimide, a phenolic compound or material, a material including a silicone dispersed therein, or a combination thereof.

Figure 2:
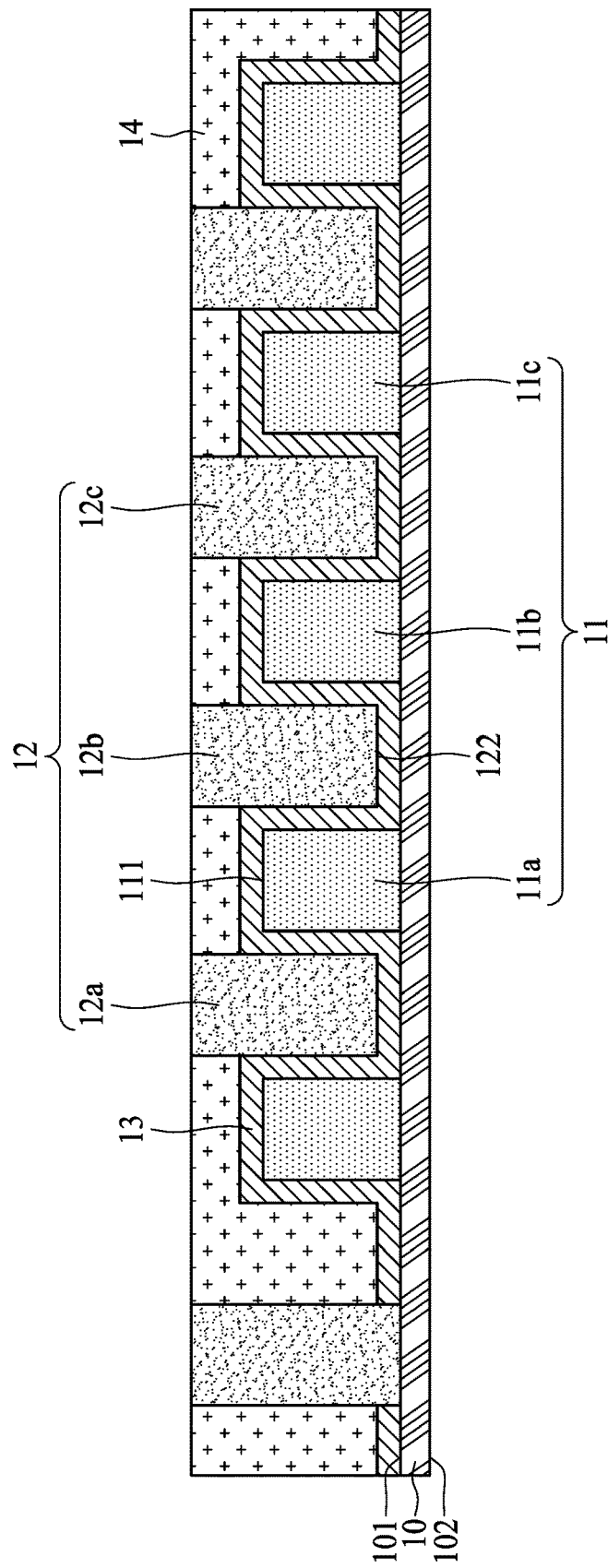
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1A, except that in the semiconductor device package 2, the conductive patterned layer 12 is isolated from the conductive pattern layer 11. For example, the conductive patterned layer 12 is not electrically connected to the conductive pattern layer 11. For example, the connection structure 15 in FIG. 1A is omitted. In some embodiments, the conductive patterned layer 12 is magnetically coupled to the conductive pattern layer 11 to form or define a transformer. For example, the conductive patterned layer 11 is a primary-side winding of the transformer and the conductive patterned layer 12 is a secondary-side winding of the transformer, and vice versa.

Figure 3A:
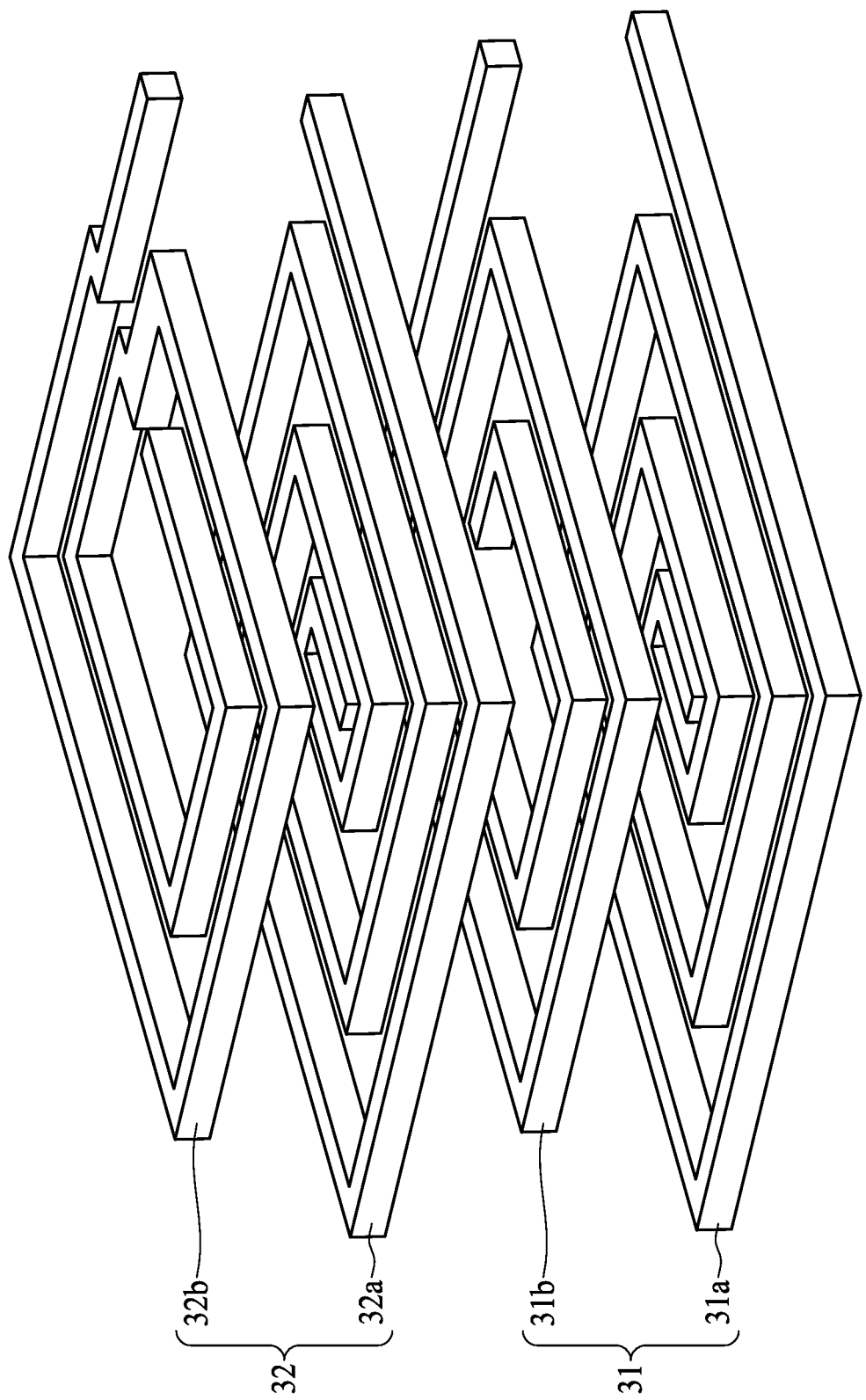
FIG. 3A illustrates a perspective view of an inductor in accordance with some embodiments of the present disclosure.
Figure 3B:
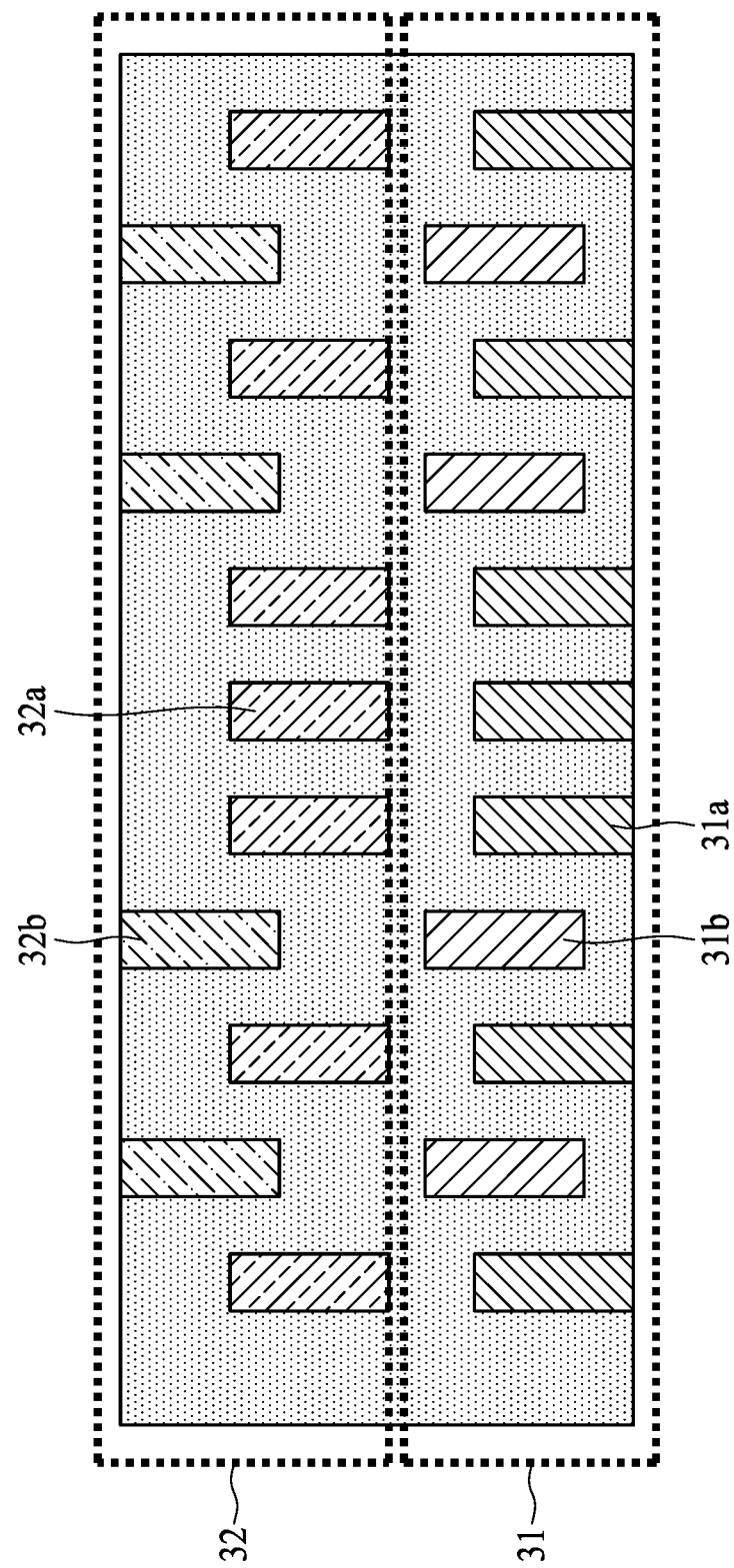
FIG. 3B illustrates a cross-sectional view of the inductor in FIG. 3A in accordance with some embodiments of the present disclosure.

FIG. 3A illustrates a perspective view of an inductor 3 in accordance with some embodiments of the present disclosure. The inductor 3 includes coils 31a, 31b, 32a and 32b disposed in a stacked structure. As shown in FIG. 3B, which illustrates a cross-sectional view of the inductor 3, the coil 31a and the coil 32a are arranged in a way similar to the arrangement of the patterned conductive layer 11 and the patterned conductive layer 12 in FIG. 1A. For example, a portion of the coil 31a and a portion of the coil 31b overlap. For example, segments of the coils 31b are disposed within recesses or gaps defined by segments of the coils 31a. The structure 32 including the coils 32a and 32b is similar to the structure 31 including the coils 31a and 31b. Compared to the inductor including the two stacked coils (e.g., the patterned conductive layer 11 and the patterned conductive layer 12) as shown in FIGS. 1A and 1B, the inductor 3 including the four stacked coils 31a, 31b, 32a and 32b has more turns of coils, which would increase the inductance of the inductor 3.

Figure 4A:
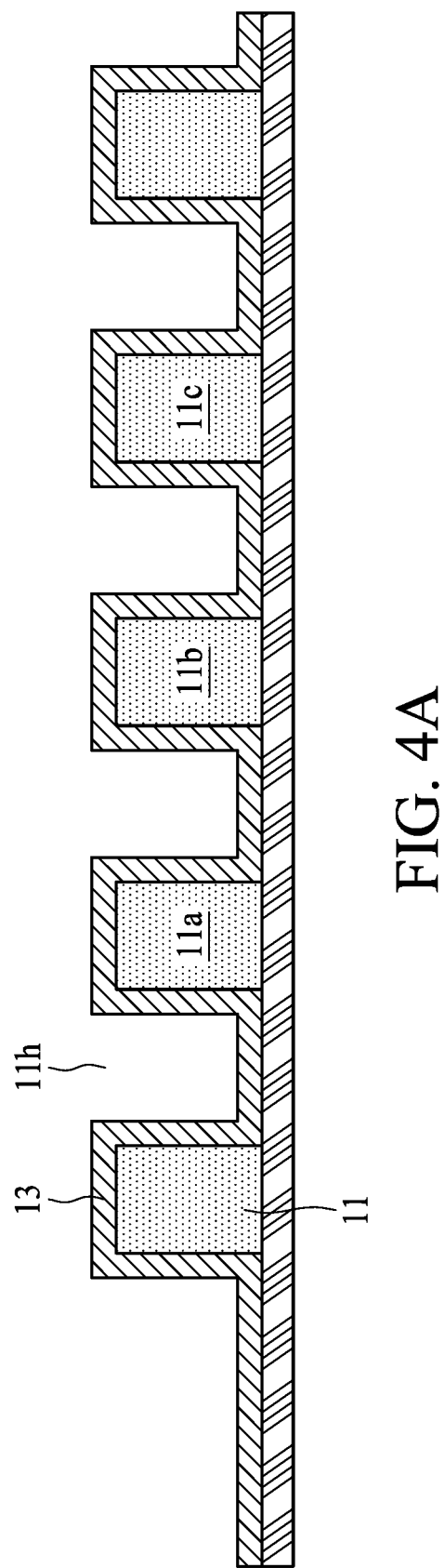
FIG. 4A, FIG. 4B, FIG. 4C, FIG. 4D, FIG. 4E and FIG. 4F illustrate a semiconductor manufacturing method in accordance with some embodiments of the present disclosure.

FIGS. 4A, 4B, 4C, 4D, 4E and 4F illustrate a semiconductor manufacturing method in accordance with some embodiments of the present disclosure. In some embodiments, the operations in FIG. 4A are carried out to manufacturing the semiconductor device package 1 in FIGS. 1A and 1B. Alternatively, the operations in FIG. 4A can be carried out to manufacturing other semiconductor device package or inductors or transformers (e.g., the semiconductor device package in FIG. 2 and the inductor 3 in 3A and 3B).

Figure 5A:
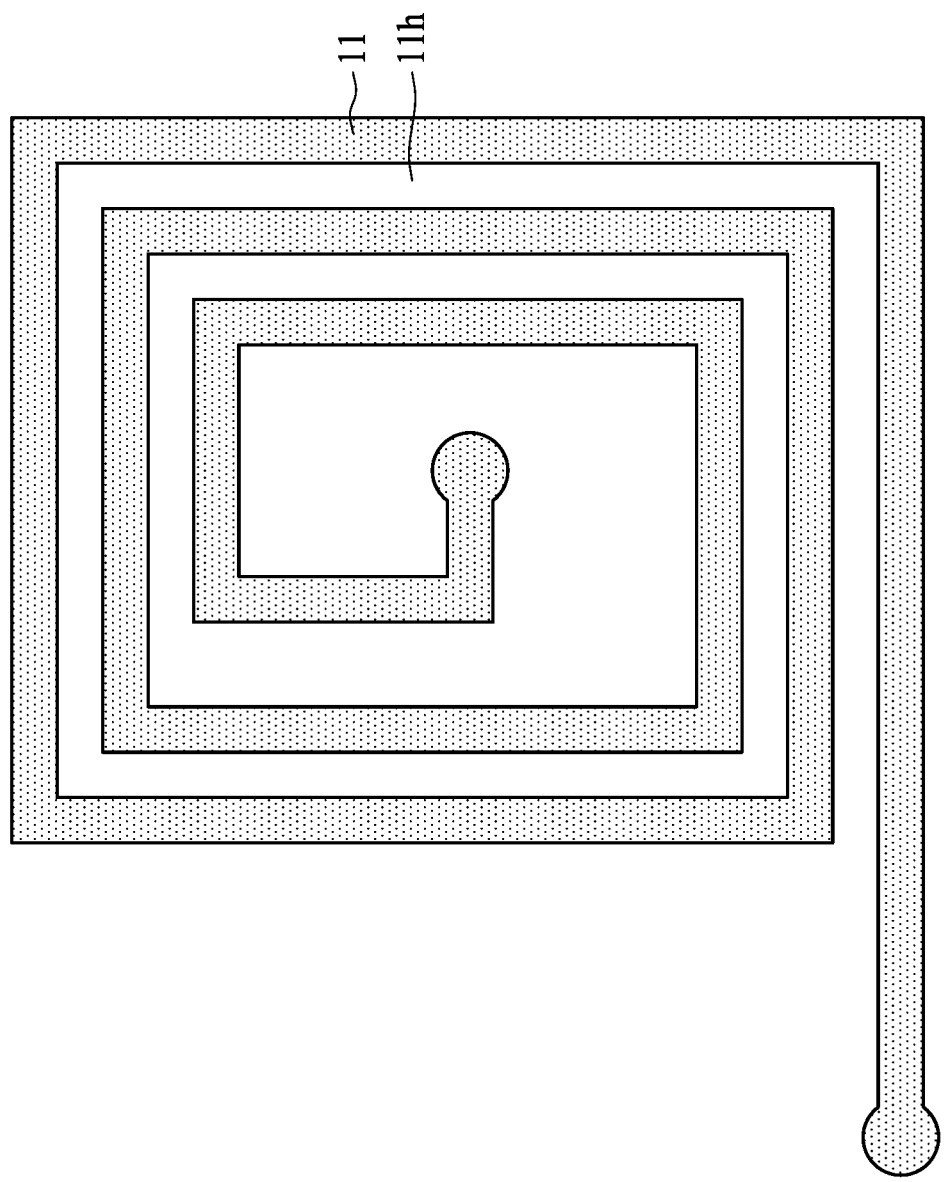
FIG. 5A and FIG. 5B illustrate a semiconductor manufacturing method in accordance with some embodiments of the present disclosure.

Referring to FIG. 4A, a substrate 10 is provided. The patterned conductive layer 11 is formed on the substrate 10. The patterned conductive layer 11 is, or includes, a conductive material such as a metal or metal alloy. As shown in FIG. 5A, which illustrates a top view of the patterned conductive layer 11, the patterned conductive layer 11 defines a spiral inductor. As shown in FIG. 4A, the patterned conductive layer 11 includes a plurality of segments separated from each other. A plurality of recesses (or gaps) 11h are defined between two adjacent segments.

The dielectric layer 13 (or passivation layer) is formed on the substrate 10 and the patterned conductive layer 11. For example, the dielectric layer 13 is conformally formed on the patterned conductive layer 11. In some embodiments, a thickness of the dielectric layer 13 is substantially uniform. In some embodiments, the dielectric layer 13 includes polymer, silicon oxide, nitride oxide, gallium oxide, aluminum oxide, scandium oxide, zirconium oxide, lanthanum oxide or hafnium oxide.

Figure 4B:
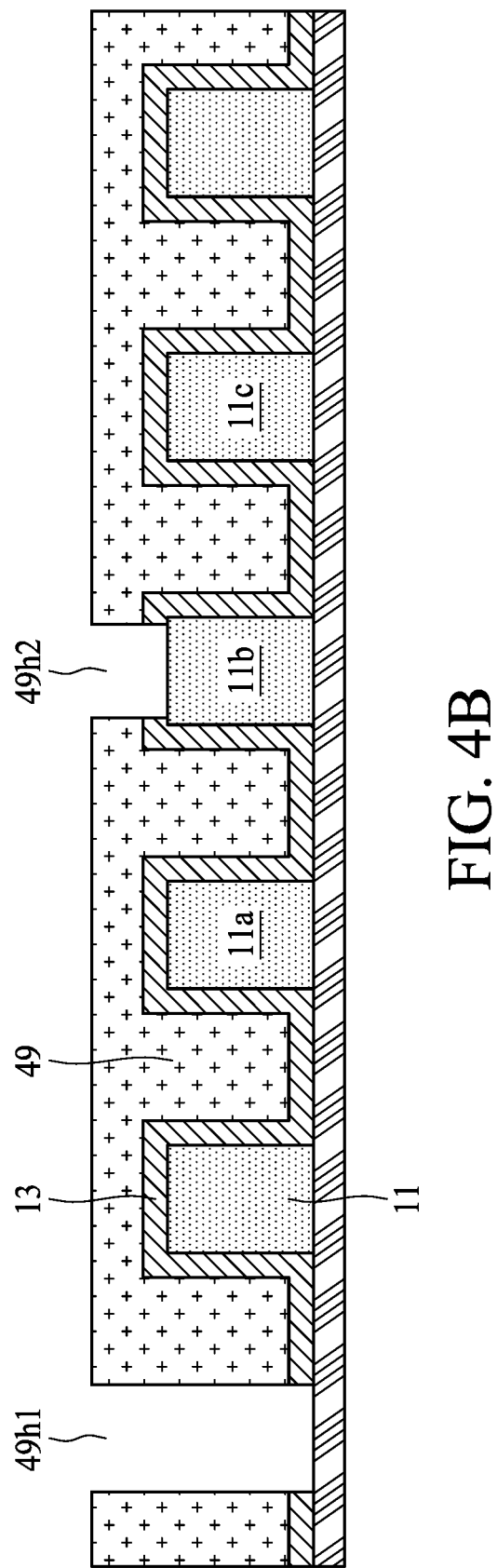

Referring to FIG. 4B, a photoresist (or mask) 49 is disposed on the dielectric layer 13. An opening 49h1 is formed to remove a portion of the photoresist 49 and the dielectric layer 13 to expose the substrate 10. An opening 49h2 is formed to remove a portion of the photoresist 49 and the dielectric layer 13 to expose a portion of the segment 11b of the patterned conductive layer 11. In some embodiments, the openings 49h1, 49h2 can be formed by drilling, laser drilling, etching or other suitable processes. In some embodiments, the openings 49h1, 49h2 can be formed by a single removal operation. In some embodiments, the openings 49h1, 49h2 can be formed by two removal operations. For example, the first removal operation is carried out to remove the photoresist 49 and the second removal operation is then carried out to remove dielectric layer 13.

Figure 4C:
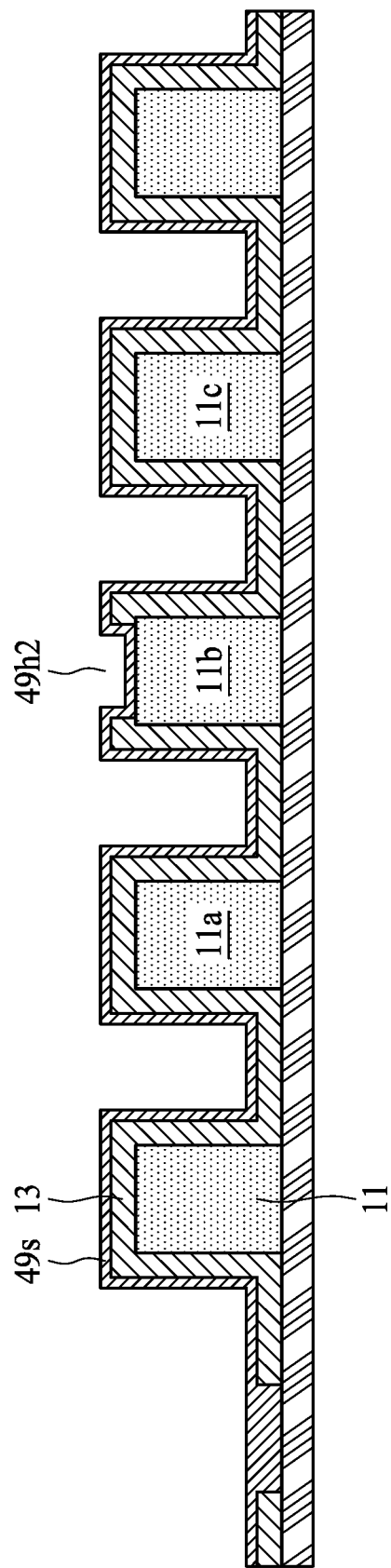

Referring to FIG. 4C, the photoresist 49 is removed and a seed layer 49s is formed on the dielectric layer 13 and a portion of the substrate 10 and the segment 11b that are exposed from the dielectric layer 13. In some embodiments, the seed layer 49s is formed by, for example, sputtering or other suitable processes.

Figure 4D:
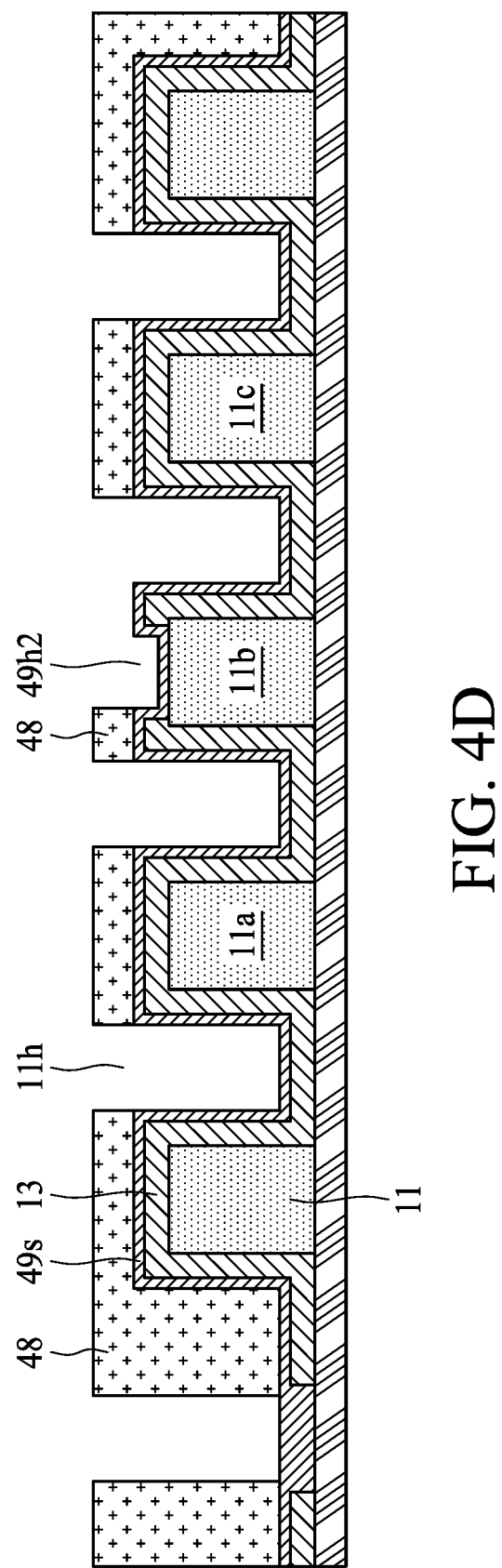

Referring to FIG. 4D, a photoresist 48 (or mask) is disposed on the seed layer 49s, and a portion of the photoresist 48 is removed to expose the recesses 11h defined by the segments 11a, 11b, 11c of the patterned conductive layer 11, a portion of the seed layer 49s that is disposed on the segment 11b and the substrate 10. In some embodiments, the portion of the photoresist 48 can be formed by drilling, laser drilling, etching or other suitable processes. In some embodiments, the portion of the photoresist 48 can be removed by a single removal operation or multiple removal operations depending on design specifications.

Figure 4E:
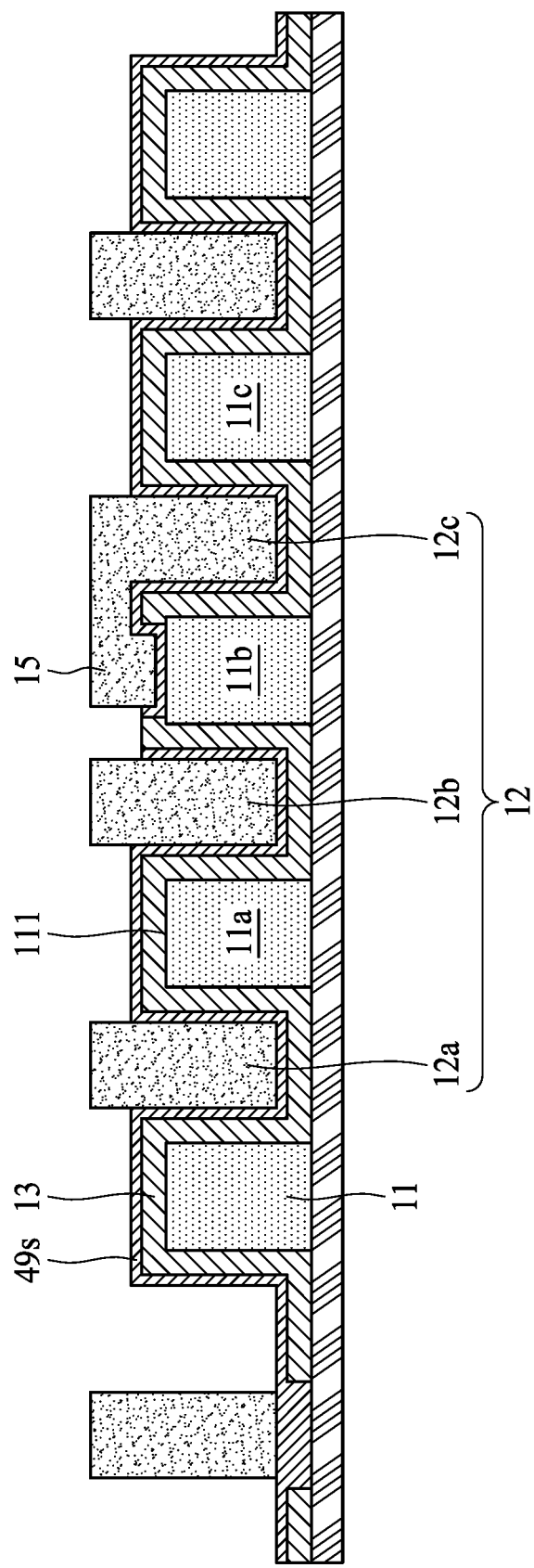
Figure 5B:
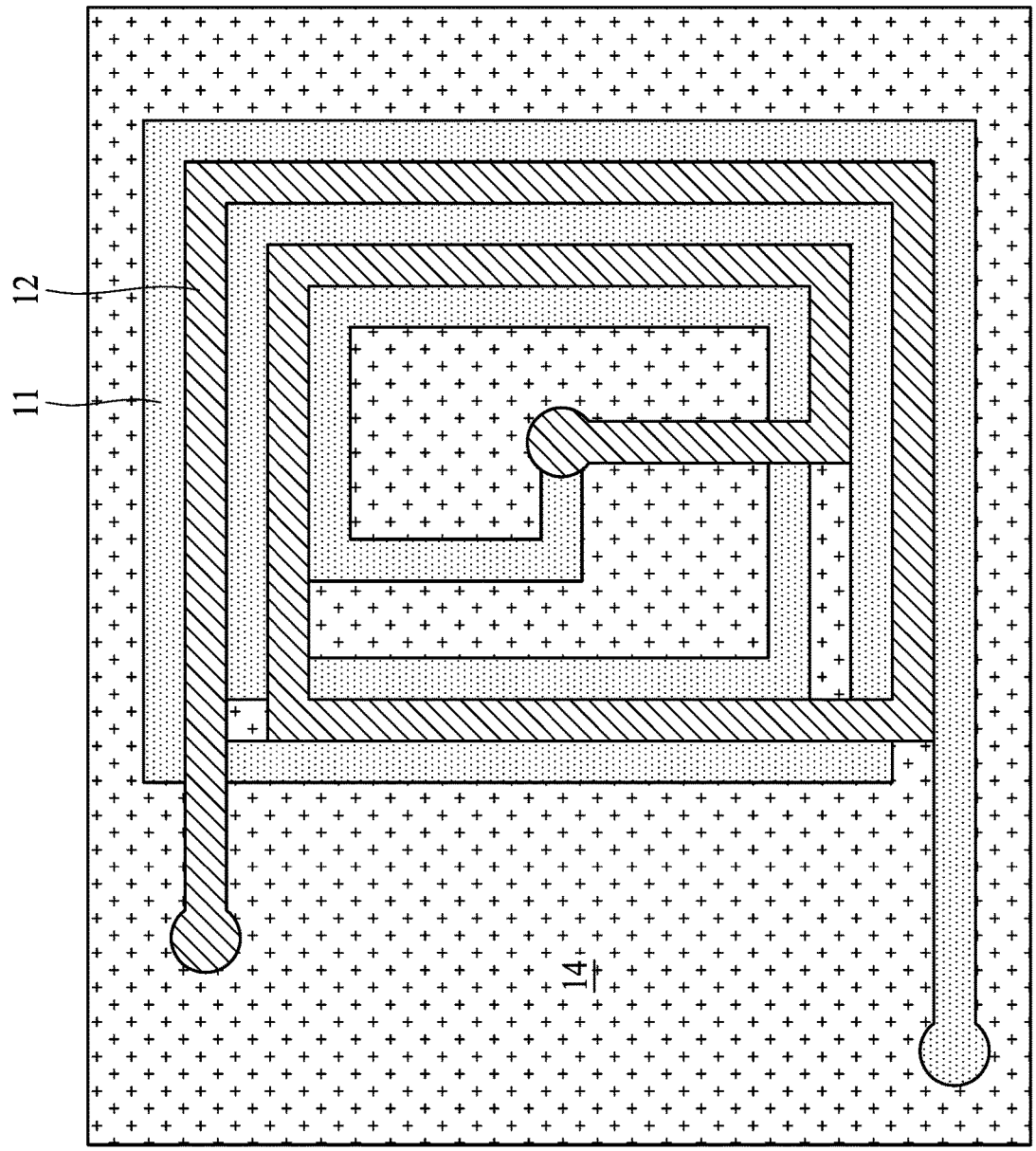

Referring to FIG. 4E, the patterned conductive layer 12 and the connection structure 15 are formed by, for example, plating or other suitable processes. For example, as shown in FIG. 5B, which illustrates a top view of the patterned conductive layer 12, the patterned conductive layer 12 define a spiral inductor which is disposed within the recesses 11h defined by the segments of the patterned conductive layer 11. For example, as shown in FIG. 4E, the patterned conductive layer 12 includes a plurality of segments 12a, 12b, 12c disposed within the recesses defined by the segments of the patterned conductive layer 11. The patterned conductive layer 12 is, or includes, a conductive material such as a metal or metal alloy.

Figure 4F:
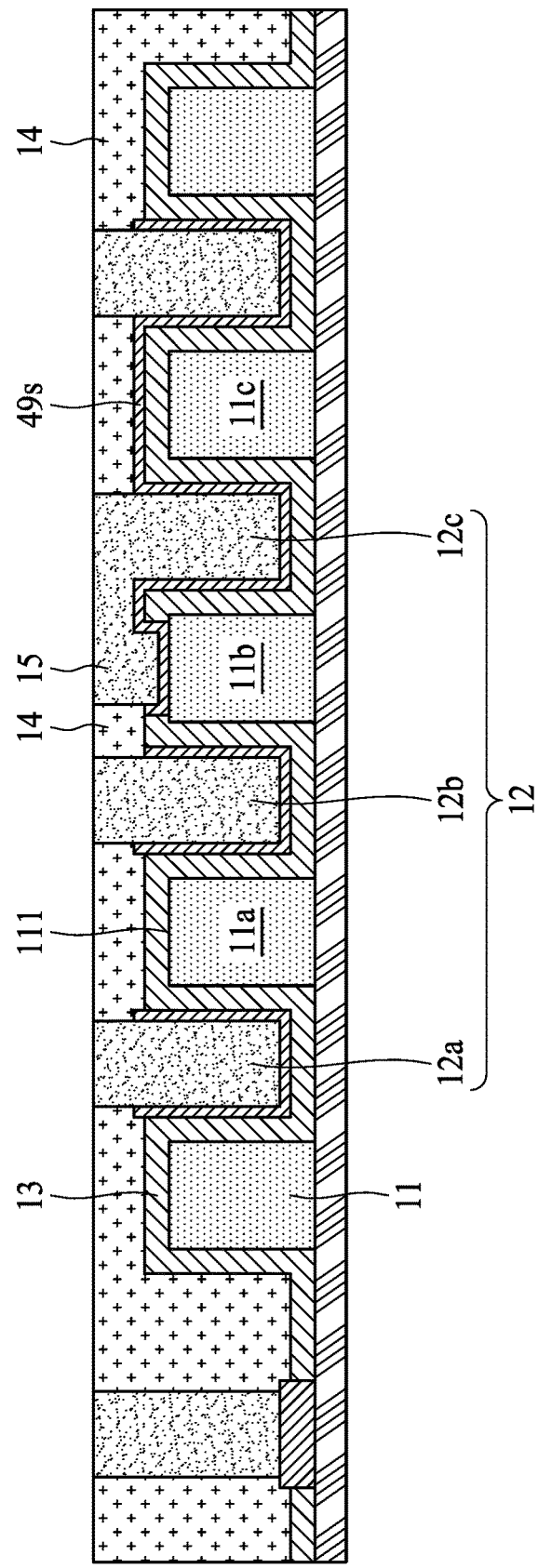

Referring FIG. 4F, a portion of the seed layer 49s that is not in contact with patterned conductive layer 12 is removed by, for example, etching (e.g., wet etching) or other suitable processes. Then, the package body 14 is formed to cover the patterned conductive layers 11, 12, the dielectric layer 13 and the connection structure 15 to form the semiconductor device package 4. In some embodiments, the package body 14 may be formed by a molding technique, such as transfer molding or compression molding. The semiconductor device package 4 is similar to the semiconductor device package 1 in FIG. 1A, except that the semiconductor device package 4 further includes a seed layer 49s between the patterned conductive layer 12 and the dielectric layer 13.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate;
   a first coil disposed on the substrate, the first coil including a first conductive segment and a second conductive segment;
   a dielectric layer covering the first conductive segment of the first coil and the second conductive segment of the first coil and defining a first recess between the first conductive segment of the first coil and the second conductive segment of the first coil;
   a second coil disposed on the dielectric layer, the second coil including a first conductive segment disposed within the first recess; and
   a connection structure in direct physical contact with the first coil and the second coil; wherein
   the first coil further includes a third conductive segment disposed on the substrate and spaced apart from the second conductive segment of the first conductive coil;
   the dielectric layer covers the third conductive segment of the first coil and defines a second recess between the second conductive segment of the first coil and the third conductive segment of the first coil;
   the second coil further includes a second conductive segment disposed within the second recess; and
   the connection structure is disposed across a top surface of the second conductive segment of the first coil and electrically connecting to a portion of a lateral surface of the second conductive segment of the second coil.

2. The semiconductor device package of claim 1, wherein a thickness of the connection structure is less than a thickness of the first conductive segment of the first coil or a thickness of the first conductive segment of the second coil.

3. The semiconductor device package of claim 1, wherein the first conductive segment of the first coil and the first conductive segment of the second coil overlap in a direction parallel to a top surface of the substrate.

4. The semiconductor device package of claim 1, wherein
   the first conductive segment of the first coil has a top surface facing away a top surface of the substrate;
   the first conductive segment of the second coil has a bottom surface facing toward the top surface of the substrate; and
   a distance between the top surface of the first conductive segment of the first coil and the top surface of the substrate is greater than a distance between the bottom surface of the first conductive segment of the second coil and the top surface of the substrate.

5. The semiconductor device package of claim 1, wherein the first conductive segment of the second coil comprises a first portion within the first recess and a second portion protruded out of the first recess, and a width of the first portion of the first conductive segment of the second coil is substantially the same as a width of the second portion of the first conductive segment of the second coil.

6. The semiconductor device package of claim 1, wherein the first coil is separated from the second coil and magnetically coupled to the second coil.

7. The semiconductor device package of claim 1, wherein a current in the first coil and a current in the second coil flow in the same direction.

8. The semiconductor device package of claim 1, wherein the first conductive segment of the first coil has a top surface facing away a top surface of the substrate, and the dielectric layer covers the top surface of the first conductive segment of the first coil.

9. The semiconductor device package of claim 1, wherein the dielectric layer directly contacts the substrate.

10. The semiconductor device package of claim 1, further comprising a package body directly contacting the second coil, wherein a portion of the package body is between the first conductive segment and the second conductive segment of the second coil.

11. The semiconductor device package of claim 1, wherein the dielectric layer has an opening above the second conductive segment of the first coil, and the connection structure passes through the opening to physically contact the second conductive segment of the first coil.

* * * * *